United States Patent
Lee et al.

(10) Patent No.: US 6,214,661 B1
(45) Date of Patent: Apr. 10, 2001

(54) METHOD TO PREVENT OXYGEN OUT-DIFFUSION FROM BSTO CONTAINING MICRO-ELECTRONIC DEVICE

(75) Inventors: Heon Lee, Sunnyvale, CA (US); Young-Jin Park; Young Limb, both of Poughkeepsie, NY (US); Brian Lee, New York, NY (US); Kilho Lee, Wappingers Falls, NY (US); Satish Athavale, Fishkill, NY (US); Jai-hoon Sim, White Plains, NY (US)

(73) Assignees: Infineon Technologoies North America Corp., San Jose, CA (US); International Business Machines Corp., Armonk, NY (US)

( * ) Notice: Subject to any disclaimer, the term of this patent is extended or adjusted under 35 U.S.C. 154(b) by 0 days.

(21) Appl. No.: 09/489,771

(22) Filed: Jan. 21, 2000

(51) Int. Cl.$^7$ ............................................... H01L 21/8242
(52) U.S. Cl. ........................ 438/240; 438/3; 438/253; 438/676; 438/659; 438/238
(58) Field of Search .................. 438/3, 253, 676, 438/659, 240, 238

(56) References Cited

U.S. PATENT DOCUMENTS

| | | | |
|---|---|---|---|
| 5,568,352 | * 10/1996 | Hwang | 361/321.4 |
| 5,846,859 | * 12/1998 | Lee | 438/253 |
| 5,858,851 | * 1/1999 | Yamagata et al. | 438/396 |
| 5,965,942 | * 10/1999 | Itoh et al. | 257/761 |
| 5,985,676 | * 11/1999 | New | 438/3 |
| 6,027,966 | * 2/2000 | Saenger et al. | 438/239 |
| 6,046,059 | * 4/2000 | Shen et al. | 438/3 |

* cited by examiner

Primary Examiner—Matthew Smith
Assistant Examiner—V. Yevsikov
(74) Attorney, Agent, or Firm—Stanton Braden

(57) ABSTRACT

In a method of forming a microelectronic structure of a Pt/BSTO/Pt capacitor stack for use in a DRAM device, the improvement comprising substantially eliminating or preventing oxygen out-diffusion from the BSTO material layer, comprising:
  a) preparing a bottom Pt electrode formation;
  b) subjecting the bottom Pt electrode formation to an oxygen plasma treatment to form an oxygen enriched Pt layer on the bottom Pt electrode;
  c) depositing a BSTO layer on said oxygen enriched Pt layer;
  d) depositing an upper Pt electrode layer on the BSTO layer;
  e) subjecting the upper Pt electrode layer to an oxygen plasma treatment to form an oxygen incorporated Pt layer; and
  f) depositing a Pt layer on the oxygen incorporated Pt layer upper Pt elect.

6 Claims, 6 Drawing Sheets

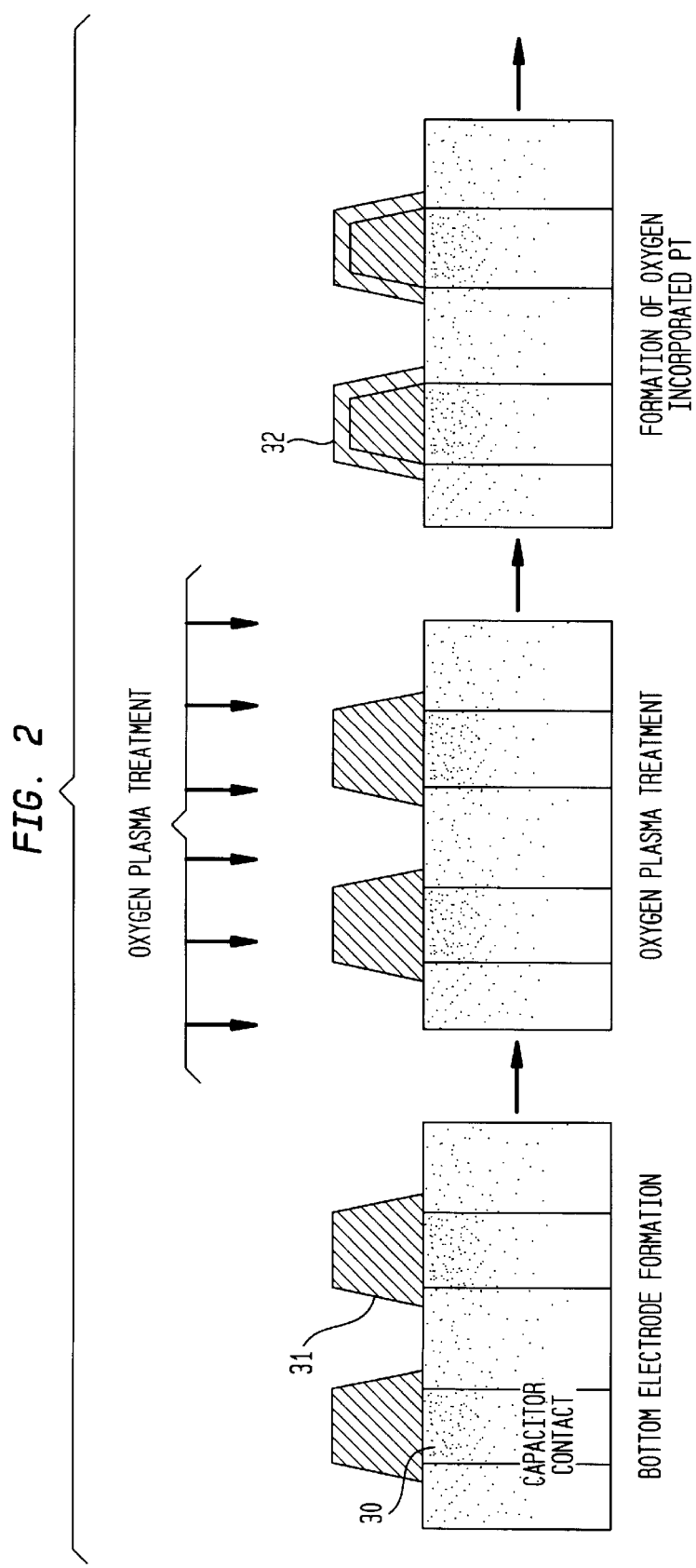

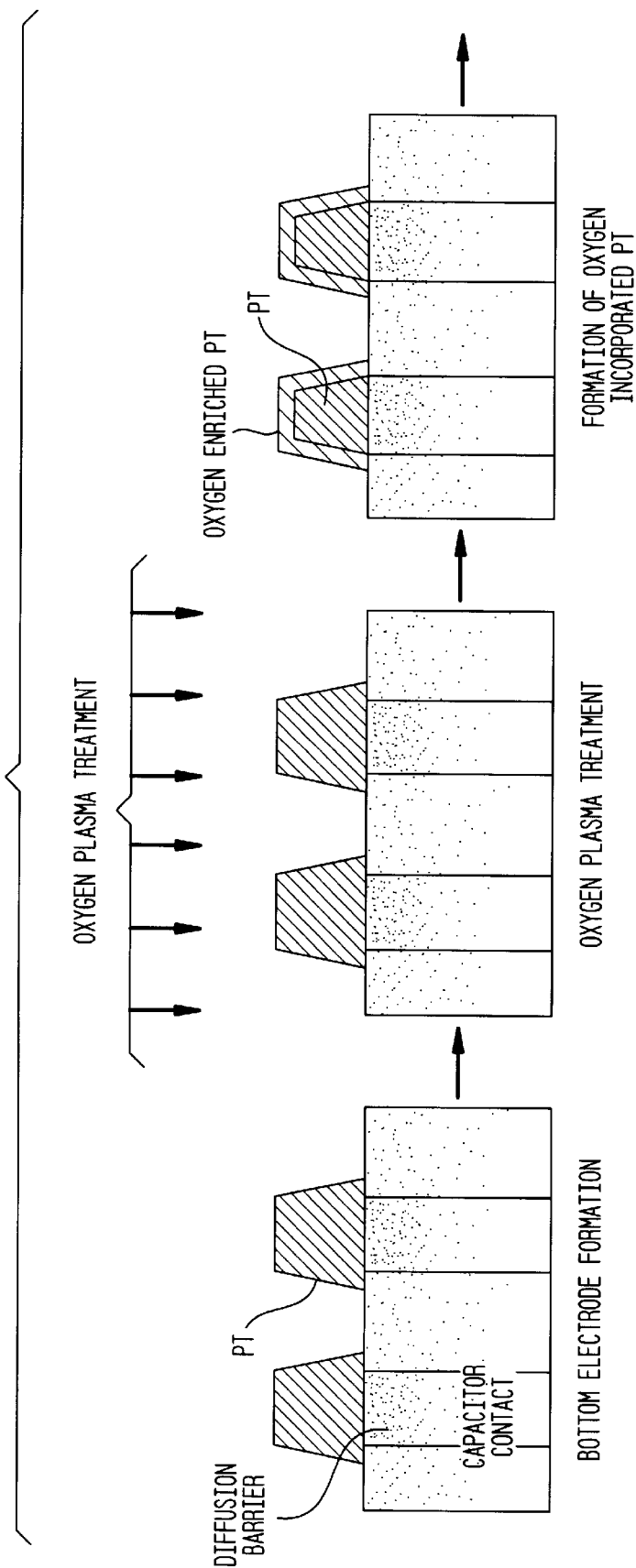

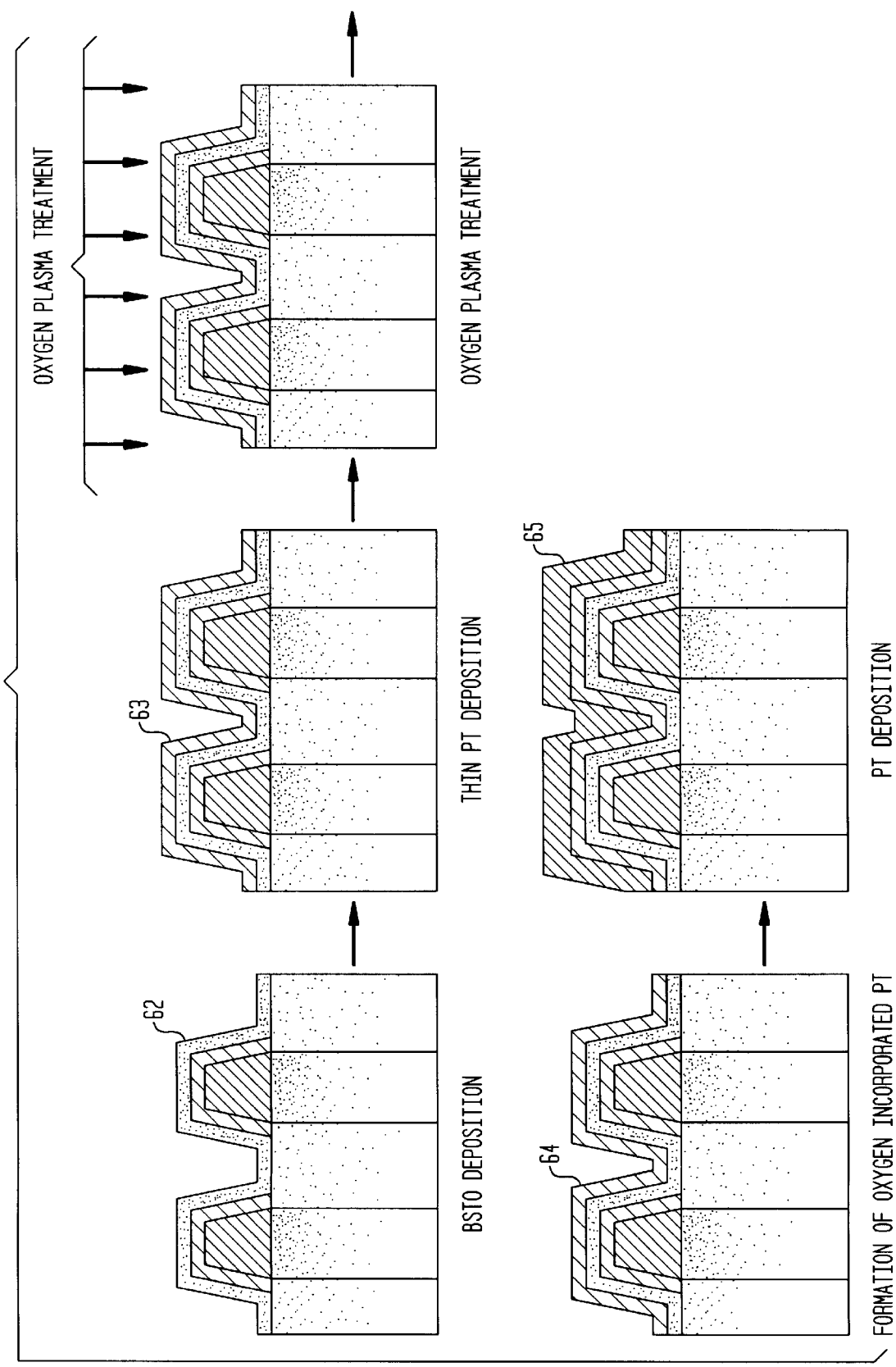

METHOD TO PREVENT OXYGEN OUT-DIFFUSION FROM BSTO CONTAINING MICRO-ELECTRONIC DEVICE

FIELD OF THE INVENTION

Field of the Invention

The invention generally relates to improving prevention of oxygen out-diffusion from barium strontium titanate (BSTO) which is a material with a high-dielectric-constant (HDC) used in integrated circuits (e.g. DRAMs) that is used in electrical devices such as capacitors.

BACKGROUND OF THE INVENTION

The demand for greater memory has required increasing density of integrated circuits, such as dynamic random access memory (DRAMs) by increasing the need for materials with high-dielectric-constants for use in electrical devices such as capacitors.

In general, capacitance relates directly to the surface area of the electrode in contact with the capacitor dielectric, but is not affected in any significant way by the electrode volume. Contemporary methods generally utilized to achieve higher capacitance per unit area entails increasing the surface area/unit area by increasing the topography, such as in stack capacitors using $SiO_2$ or $SiO_2/Si_3N_4$ as the dielectric. However, this approach is very difficult for the manufacturability for devices such as 256 Mbit and 1 Gbit DRAMs.

An alternative approach is to use high permittivity dielectric materials since many high-dielectric-constant (HDC) materials such as BSTO have much larger capacitance densities than standard $SiO_2$—$Si_3N_4$—$SiO_2$ capacitors. In this connection, certain metallic compounds and metals such as the noble metals, and in particular, Pt has been used as the electrode for these HDC BSTO materials. However, to be reliable in electronic devices, the devices must be constructed in a manner which do not diminish the beneficial properties of these high-dielectric-constant materials.

In any case, HDC materials such as BSTO are generally not chemically stable when deposited directly on a conductor substrate, thereby requiring an additional layer to be deposited over the HDC materials. The additional layer should generally be chemically stable when in contact with the substrate and also when in contact with the high-dielectric-constant material.

Further, because of the unit area constraints, high density devices (e.g. 256 Mbit and 1 Gbit DRAMs) would normally require a structure wherein the lower electrode is conductive from the HDC material down to the substrate. The deposition of an HDC material generally proceeds at high temperatures (greater than about 500° C.) in an oxygen containing atmosphere. Therefore, an initial electrode structure formed prior to this deposition must be stable both during and after this HDC deposition, while later electrode structures formed after this deposition only need to be stable after this latter deposition.

Further, several problems exists with materials selected for electrodes in standard thin-film applications. In the case of Pt when used as an electrode, although Pt is unreactive with the HDC material, Pt generally allows oxygen to diffuse through it from the underlying BSTO HDC material in the capacitor stack to the ambient during post deposition heat treatment and can cause severe degradation of the BSTO.

U.S. Pat. No. 5,381,302 disclose a storage node capacitor and a method for forming the same by forming a conductive plug in a thick layer of insulative material such as oxide or oxide/nitride. The conductive plug is recessed from a planarized top surface of the thick insulative layer. A low contact material is formed at the base of the recess, and the barrier layer is then formed in the recess. The process is continued with the formation of an oxidation resistant conductive layer and the patterning of the same to complete the formation of the storage node electrode. Since the barrier layer is protected during the formation of the dielectric layer by both the oxidation resistant conductive layer and the thick insulative layer, there is no oxidation of the barrier layer or the contact plug, thereby maximizing capacitance of the storage node.

A method of forming a microelectronic structure is disclosed in U.S. Pat. No. 5,665,628, and comprises an oxidizable layer, an amorphous nitride barrier layer overlying the oxidizable layer, an oxygen stable layer (platinum) overlying the amorphous nitride layer, and a high-dielectric-constant material layer (BSTO) overlying the oxygen stable layer. The amorphous nitride barrier layer substantially inhibits diffusion of oxygen to the oxidizable layer, and thereby minimizes deleterious oxidation of the oxidizable layer.

U.S. Pat. No. 5,585,300 disclose a method of making conductive amorophous-nitride barrier layers for high-dielectric constant material electrodes in which an oxygen stable platinum layer overlies an amorphous-nitride layer that is disposed over an oxidizable layer, and wherein a high-dielectric-constant material layer of BSTO overlies the oxygen stable layer.

A conductive exotic-nitride barrier layer for high-dielectric constant material electrodes is disclosed in U.S. Pat. No. 5,851,896 and comprises an oxidizable layer, a conductive exotic-nitride barrier layer overlying the oxidizable layer, an oxygen stable layer (platinum) overlying the exotic-nitride layer, and a high-dielectric constant material layer (BSTO) overlying the oxygen stable layer. The exotic-nitride barrier layer substantially inhibits diffusion of oxygen to the oxidizable layer, thereby minimizing deleterious oxidation of the oxidizable layer.

The Pt/BSTO/Pt stack is one of the most promising capacitor materials system for next generation DRAM devices; however, even though Pt is a good oxidation resistant material, oxygen can diffuse through Pt from the BSTO layer during post deposition heat treatment. Accordingly, there is a need in this microelectronic area to devise economic means by which to better prevent the out-diffusion of oxygen from BSTO to ambient.

SUMMARY OF THE INVENTION

One object of the present invention is to provide a Pt/BSTO/Pt electrode stack as a capacitor material system for a DRAM device that substantially lessens or prevents out-diffusion of oxygen from the BSTO layer.

Another object of the present invention is to provide a Pt/BSTO/Pt stack capacitor material for use in a DRAM device that substantially lessens or prevents out-diffusion of oxygen from BSTO by insertion of a oxygen incorporated Pt layer into the BSTO/Pt interface.

A further object of the invention is to provide a method of preparing a Pt/BSTO/Pt stack capacitor material for a DRAM device that substantially lessens or prevents out-diffusion of oxygen from the BSTO material by the use of a new Pt upper electrode sputtering process that forms an oxygen incorporated Pt layer and a pure Pt layer in a single chamber by a single process.

In general, the invention method or process flow for the Pt/oxygen incorporated Pt/BSTO/ oxygen incorporated Pt/Pt capacitor stack is that, after formation of the Pt bottom electrode deposition and patterning, the surface of the Pt electrode is treated by oxygen plasma to incorporate oxygen atoms. Next, the BSTO film is deposited on the oxygen plasma treated bottom electrode. Thereafter, a thin film of Pt is conformally deposited on top of the BSTO film.

Alternatively, prevention of out-diffusion of a Pt/BSTO/Pt stack capacitor material may be accomplished by replacing the pure Pt upper electrode with a multi-layer of oxygen incorporated Pt layer and a pure Pt layer without adding an encapsulation layer using a process flow wherein, after the Pt bottom electrode deposition and patterning is completed, the surface of the Pt electrode is treated by oxygen plasma to incorporate oxygen atoms, after which the BSTO film is deposited on the oxygen plasma treated Pt bottom electrode. Thereafter, a Pt layer is sputtered on top of the BSTO film.

To form a multi-layer oxygen incorporated Pt layer and a pure Pt layer in a single chamber by single process, a modified sputtering process is used wherein, after the initial Pt sputtering stage, a small amount of oxygen is added into the plasma to incorporate oxygen into the Pt layer and deposit the same over the BSTO layer followed by purging the sputtering layer. Thereafter, the Pt is sputtered without oxygen addition to form the top electrode.

BRIEF DESCRIPTION OF THE DRAWINGS

FIG. 2 shows a schematic of the invention process flow method to prevent oxygen out-diffusion from the BSTO layer using modified Pt upper electrode sputtering, in which an oxygen plasma treatment is used on the bottom electrode formation in route to obtaining an oxygen enriched Pt layer.

FIG. 5 shows a schematic of a process flow diagram of the invention method to prevent oxygen out-diffusion from the BSTO layer using an oxygen incorporated Pt electrode stack, by subjecting the formed bottom electrode to an oxygen plasma treatment, and obtaining an oxygen enriched Pt layer.

FIG. 6 shows that, in the invention method of preventing oxygen out-diffusion from the BSTO layer using an oxygen incorporated electrode stack, the BSTO deposition is formed over the oxygen enriched Pt layer, after which a thin Pt deposition is formed over the BSTO layer. Thereafter, the thin Pt deposition is subjected to oxygen plasma treatment to form an oxygen incorporated Pt layer over which a layer of Pt is deposited.

DETAILED DESCRIPTION OF THE INVENTION

Figure 1A:
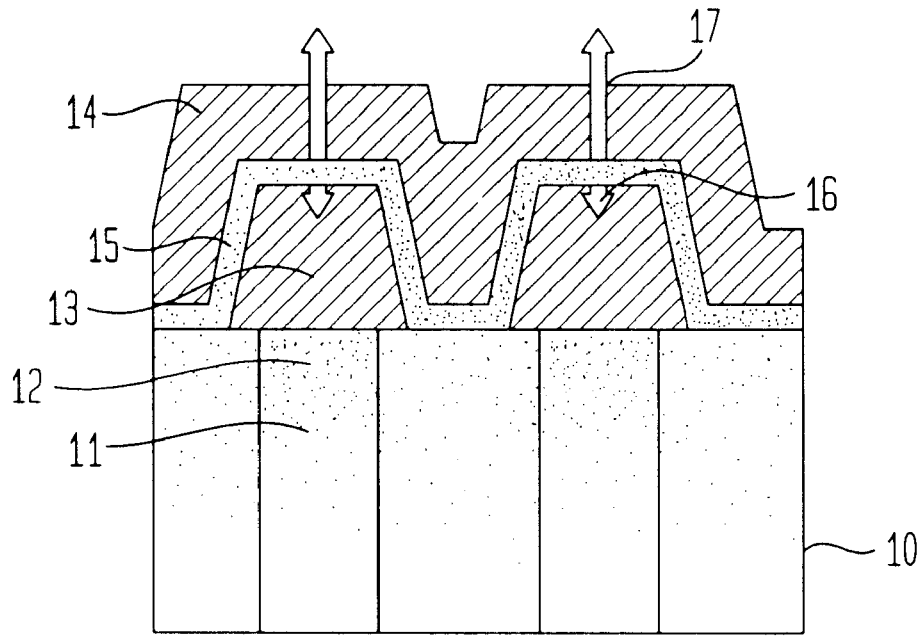
FIG. 1A is a Pt/BSTO/Pt capacitor stack of the prior art showing the significant oxygen out-diffusion area from the BSTO layer and the less significant area of the oxygen out-diffusion area of the stack.
Figure 1B:
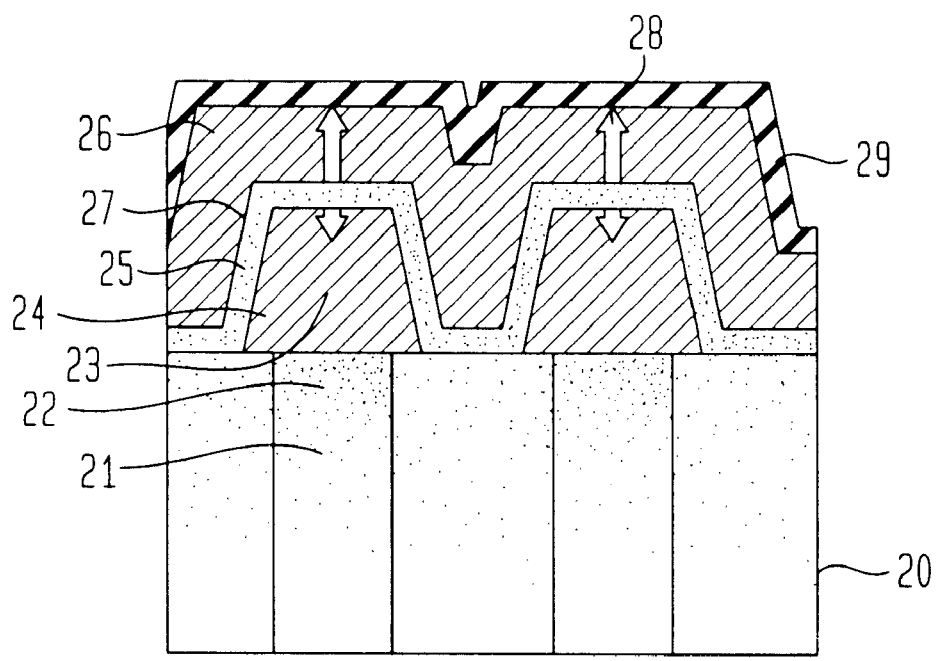
FIG. 1B shows a Pt/BSTO/Pt/$Al_2O_3$ prior art capacitor stack with encapsulation layer, and the area of the stack in which oxygen out-diffusion from the BSTO to ambient is blocked by the $Al_2O_3$ encapsulation layer.
Figure 3:
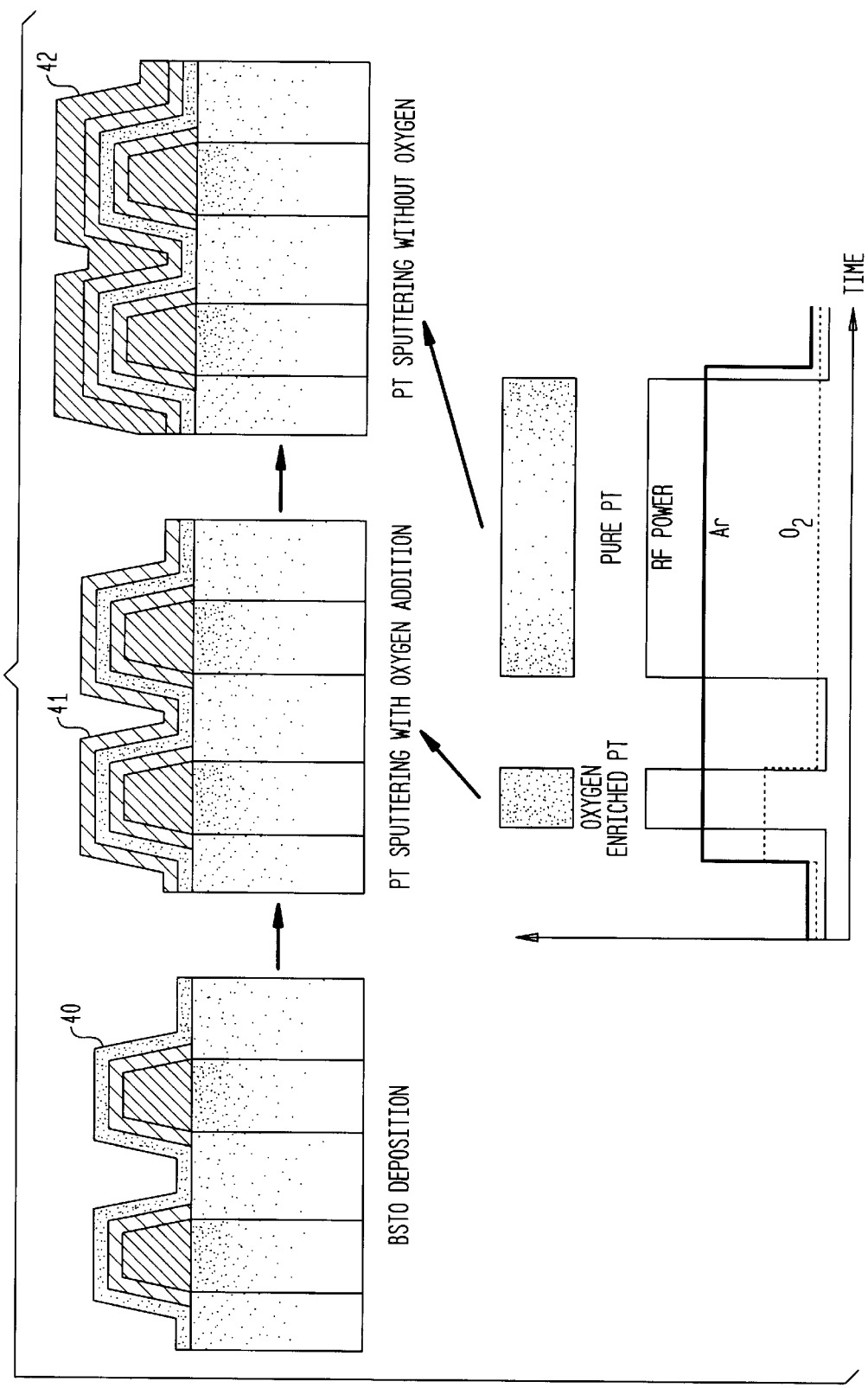
FIG. 3 shows the invention process flow method wherein, after deposition of the BSTO, Pt is sputtered with the addition of oxygen to form an oxygen enriched Pt layer. The figure also shows that, Pt sputtering may be performed without oxygen after the step of Pt sputtering with the addition of oxygen, using the invention modified Pt upper electrode sputtering process.

With reference to FIGS. 1–3, there is shown the prior art and a method of providing preferred embodiments of the aspect of the invention method to prevent oxygen out-diffusion from the BSTO layer using a modified Pt upper electrode sputtering process.

A micro-electronic structure of the prior art, as depicted in FIG. 1-A shows a Pt/BSTO/Pt capacitor stack. In this Pt/BSTO/Pt prior art capacitor stack, there is shown a capacitor contact 11 in the base area of the stack, above which there is a diffusion barrier 12, a lower Pt layer 13, and an upper Pt layer 14 separated by a BSTO layer 15. In this prior art Pt/BSTO/Pt capacitor stack, the area of less significant oxygen out-diffusion from the BSTO layer is shown by numeral 16 and the area of the significant oxygen out-diffusion from the BSTO layer is shown by numeral 17.

The increasing density of integrated circuits (e.g. DRAMs) has increased the need for materials for high-dielectric-constants to be used in electrical devices such as capacitors. In capacitors, capacitance is directly related to the surface area of the electrode in contact with the capacitor dielectric, but is not significantly affected by the electrode volume. The contemporary art means generally employed to achieve high capacitance per unit area is to increase the surface area/unit area by increasing the topography, such as in trench and stack capacitors using $SiO_2$ or $SiO_2/Si_3N_4$ as the dielectric; however, this technique is extremely difficult in terms of manufacturability for devices such as the 256 Mbit and 1 Gbit DRAMs.

An alternative approach has been to use a high permittivity dielectric material. However, high-dielectric constant (HDC) materials such as BSTO generally have much larger capacitance densities than standard $SiO_2$—$Si_3N_4$—$SiO_2$ capacitors.

Various noble metals such as Pt have been used as electrodes for these HDC materials, and, to be useful in electronic devices, reliable electrical connections must be constructed which do not diminish the beneficial properties of these high-dielectric-constant materials.

An HDC material in the context of the invention refers to one having a dielectric constant greater than about 50 at device operating temperature. However, HDC materials such as BSTO are generally not chemically stable when deposited directly on a semi-conductor substrate, and one or more additional layers are required to provide the electrical connection between the BSTO material and the substrate. Further, due to unit area constraints, high density devices (256 Mbit and 1 Gbit DRAMs) require a structure in which the lower electrode is conductive from the HDC material down to the substrate. The deposition of the BSTO HDC material generally proceeds at a high temperature greater than about 500° C. in an oxygen containing atmosphere. Therefore, the initial electrode structure formed prior to the deposition should be stable both during and after this deposition, while subsequent electrode structures formed after this initial deposition need only be stable after this latter deposition.

Despite the foregoing requirements for HDC materials when used in stack capacitors, several problems with the materials chosen for the electrodes in standard thin-film (usually less than 5 microns) applications exists. For example, although Pt is unreactive with respect to the BSTO HDC material, it is still difficult to use the Pt alone as the initial electrode. This is so because, while Pt is unreactive with respect to the BSTO HDC material, Pt allows oxygen out-diffusion from the BSTO of significance as is shown in FIG. 1-A at numeral 17.

To substantially lessen or prevent oxygen out diffusion through the Pt electrode from the BSTO layer during post deposition heat treatment (which generally proceeds at temperatures greater than about 500°) the invention process utilizes a Pt upper electrode sputtering process to form an oxygen incorporated Pt layer and a pure Pt layer in a single chamber by a single process, thereby substantially reducing or preventing out-diffusion of oxygen from the BSTO layer to ambient without the need to add an encapsulation layer, as is normally done per FIG. 1-B.

In FIG. 1-B, there is shown a Pt/BSTO/Pt/$Al_2O_3$ capacitor stack with the $Al_2O_3$ encapsulation layer of the prior art. The capacitor stack 20 comprises a capacitor contact 21, and a diffusion barrier 22, above which is disposed a Pt layer 23 surrounded by an oxygen enriched Pt layer or area 24. A BSTO HDC layer 25 separates the lower and upper Pt layer 26, below which there is an oxygen enriched Pt area 27 immediately adjacent the BSTO layer. As can be seen by the area designated by numeral 28, the oxygen out-diffusion from the BSTO to ambient is blocked by the $Al_2O_3$ encapuslation layer 29. This thin layer of $Al_2O_3$ has a very low oxygen diffusion coefficient, and is typically deposited on top of the Pt upper electrode.

The invention method employs a new Pt upper electrode sputtering process that forms an oxygen incorporated Pt layer and a pure Pt layer in a single chamber by single process, thereby replacing the pure Pt upper electrode with a multi-layer of an oxygen incorporated lower Pt layer and a pure Pt layer to allow out-diffusion of oxygen from the HDC BSTO to ambient through the upper electrode to be greatly reduced or eliminated without adding an encapuslating layer, as is shown by the schematics in FIGS. 2 and 3.

In FIG. 2, there is shown the diffusion barrier 30 and the Pt bottom electrode 31, from the bottom electrode formation. After the Pt bottom electrode deposition and patterning, the surface of the Pt electrode is treated by oxygen plasma to incorporate oxygen atoms (since the major oxygen out-diffusion path is through the upper electrode, this added process step is optional during post heat treatment to cure the BSTO.)

Referring now to FIG. 3, it can be seen that after the BSTO deposition over the oxygen enriched Pt layer 32 shown in FIG. 2, the HDC BSTO layer 40 is deposited. Next, on top of the BSTO film, Pt with oxygen addition is sputtered onto the BSTO layer to form an oxygen enriched Pt layer 41. In order to form a multi-layer of oxygen incorporated or oxygen enriched Pt layer and a pure Pt layer in a single chamber by a single process, Pt is sputtered without oxygen following the step of Pt sputtering with oxygen addition to form a Pt layer 42.

In an alternative embodiment of the invention for substantially eliminating or preventing oxygen out-diffusion from the HDC BSTO layer in a Pt/BSTO/Pt capacitor stack, the invention method provides for insertion of an oxygen incorporated Pt layer into the BSTO/Pt interface to prevent out-diffusion of oxygen from the BSTO.

Figure 4A:
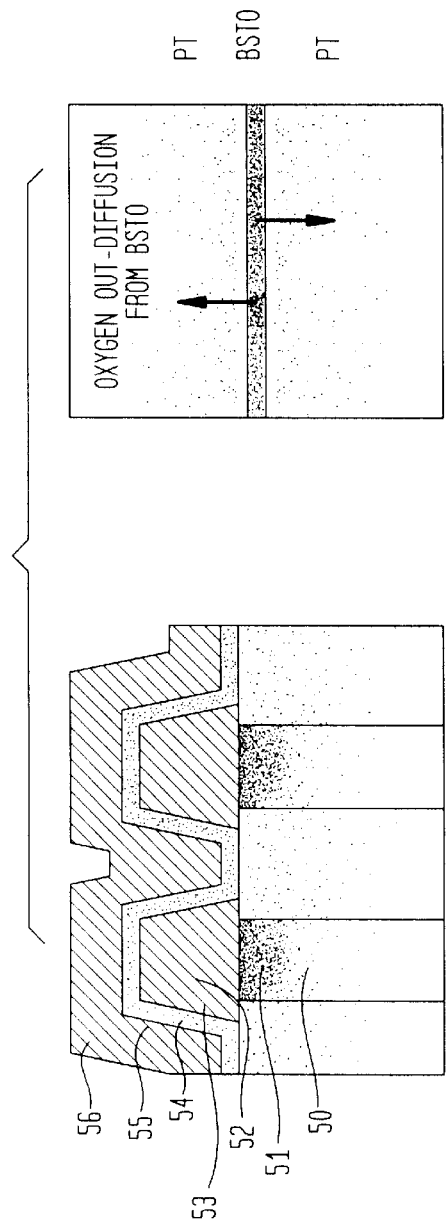
FIG. 4A shows a Pt/BSTO/Pt capacitor stack of the prior art and the area of the stack in which oxygen out-diffusion from the BSTO layer proceeds.

As can be seen from FIG. 4A, a prior art Pt/BSTO/Pt capacitor stack comprises a capacitor contact, a diffusion barrier 51, a platinum electrode 52, an oxygen enriched Pt area 53, and a surrounding BSTO material 54. Immediately adjacent the BSTO material is an oxygen enriched Pt area 55 on top of which there is a pure Pt layer 56. As may be seen from the right hand diagram in FIG. 4A, oxygen out-diffusion from the BSTO layer proceeds through the upper and lower Pt layers, with the most significant rate of oxygen out-diffusion proceeding through the path of the upper Pt electrode.

Figure 4B:
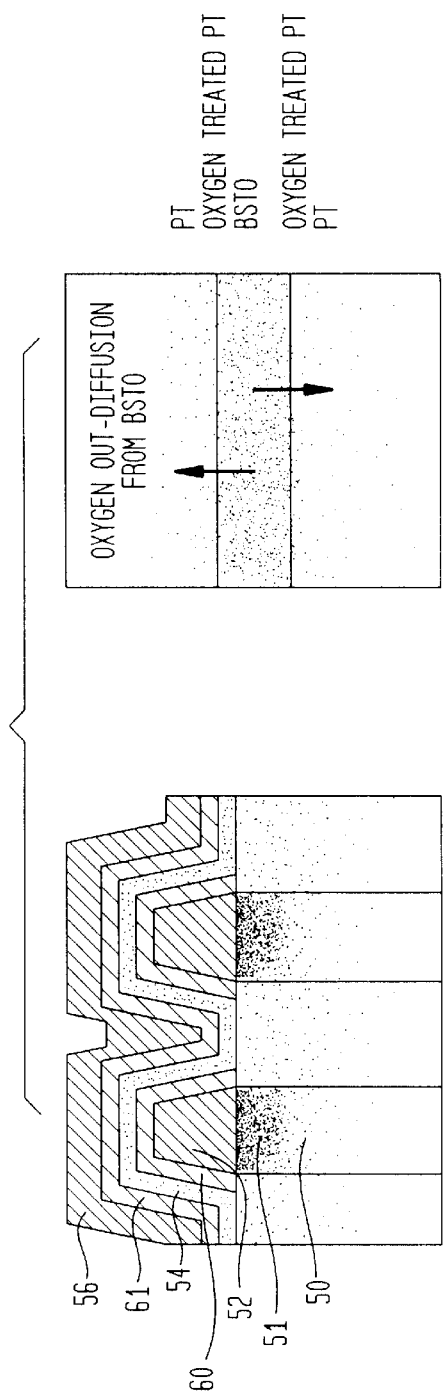
FIG. 4B shows a Pt/BSTO/Pt capacitor stack of the invention comprising oxygen treated Pt layers.

By insertion of an oxygen incorporated Pt layer as an oxygen enriched Pt layer around the lower Pt layer and above the BSTO layer, as layer 61, there is provided oxygen treated Pt layers both above and below the BSTO layer. As shown in the right-hand diagram in FIG. 4B, oxygen out-diffusion is substantially lessened or eliminated, thereby preventing degradation of the BSTO layer.

FIGS. 5 and 6 show a flow chart of the invention process for preparing a Pt/oxygen incorporated Pt/BSTO/oxygen incorporated Pt/Pt capacitor stack that substantially lessens or prevents oxygen out-diffusion from the BSTO layer. As may be seen from FIG. 5, after the Pt bottom electrode deposition and patterning, the surface of the Pt electrode is treated by oxygen plasma in order to perform oxygen incorporated Pt as an oxygen enriched Pt layer surrounding the Pt electrode.

From the schematic diagram in FIG. 6, it may be seen that the BSTO film 62 is deposited on the oxygen enriched Pt layer followed by a thin deposition of Pt layer 63. The thickness of the BSTO film is controlled through the thickness of oxygen penetration thickness during the oxygen plasma treatment. If necessary, heat treatment can be added into this step to assure formation of oxygen incorporation. After the thin Pt layer is deposited, the Pt layer 63 is subjected to oxygen plasma treatment to form an oxygen enriched Pt layer 64, followed by deposition of a Pt layer 65 to form a top electrode.

While the invention has been described with reference to preferred illustrative embodiments, the description is not intended to be limiting, and various modifications and combinations of the illustrative embodiments of the invention will be apparent to persons skilled in the art upon reference to the description. It is accordingly intended that the appended claims encompass any and all modifications or embodiments.

What is claimed is:

1. In a method of forming a microelectronic structure of a Pt/BSTO/Pt capacitor stack for use in a DRAM device, the improvement comprising substantially eliminating or preventing oxygen out-diffusion from the BSTO material layer, comprising:

a) preparing a bottom Pt electrode formation;

b) subjecting said bottom Pt electrode formation to an oxygen plasma treatment to form an oxygen enriched Pt layer on said bottom Pt electrode;

c) depositing a BSTO layer on said oxygen enriched Pt layer;

d) depositing an upper Pt electrode layer on said BSTO layer;

e) subjecting said upper Pt electrode layer to an oxygen plasma treatment to form an oxygen incorporated Pt layer; and f) depositing a Pt layer on said oxygen incorporated Pt layer upper Pt electrode.

2. A microelectronic structure of an improved Pt/BSTO/Pt capacitor stack for use in a DRAM device that substantially eliminates or prevents oxygen out-diffusion from the BSTO material layer, comprising a:

Pt/oxygen incorporated Pt/BSTO/oxygen incorporated Pt/Pt capacitor stack.

3. In a method of forming a microelectronic structure of a Pt/BSTO/Pt capacitor stack for use in a DRAM device, the improvement comprising substantially eliminating or preventing oxygen out-diffusion from the BSTO material layer without the use of an encapsulation layer comprising:

a) preparing a bottom Pt electrode formation;

b) depositing a BSTO layer on said bottom Pt electrode formation;

c) sputtering a Pt layer with the addition of oxygen onto said BSTO layer; and d) sputtering a Pt layer without oxygen onto said Pt layer with oxygen to form a multi-layer of oxygen incorporated Pt layer and a pure Pt layer in a single chamber in a single process.

4. The method of claim 3 wherein, after step a) and before step b), said bottom Pt electrode formation is subjected to an oxygen plasma treatment to form an oxygen incorporated bottom Pt electrode.

5. A microelectronic structure of an improved Pt/BSTO/Pt capacitor stack for use in a DRAM device that substantially eliminates or prevents oxygen out-diffusion from the BSTO material layer, comprising a:

multilayer Pt/BSTO/oxygen incorporated sputtered Pt/Pt stack.

6. In a method of forming a microelectronic structure of a Pt/BSTO/Pt capacitor stack for use in a DRAM device, the improvement comprising substantially eliminating or preventing oxygen out-diffusion from the BSTO material layer without the use of an encapsulation layer comprising:

a) preparing a bottom Pt electrode formation;

b) depositing a BSTO layer on said bottom Pt electrode formation; and c) sputtering a Pt layer with the addition of oxygen onto said BSTO layer.

\* \* \* \* \*